(12) United States Patent
Yosui

(10) Patent No.: US 9,979,087 B2
(45) Date of Patent: May 22, 2018

(54) COIL DEVICE AND ANTENNA DEVICE

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 268 days.

(21) Appl. No.: 14/656,855

(22) Filed: Mar. 13, 2015

(65) Prior Publication Data

US 2015/0188228 A1 Jul. 2, 2015

Related U.S. Application Data

(63) Continuation of application No. PCT/JP2014/052021, filed on Jan. 30, 2014.

(30) Foreign Application Priority Data

Feb. 6, 2013 (JP) .................................. 2013-021057

(51) Int. Cl.
*H01Q 7/00* (2006.01)
*H01Q 7/06* (2006.01)
(Continued)

(52) U.S. Cl.
CPC .......... *H01Q 7/00* (2013.01); *H01F 17/0013* (2013.01); *H01Q 1/2283* (2013.01); *H01Q 1/243* (2013.01);
(Continued)

(58) Field of Classification Search
CPC ......... H01Q 7/00; H01Q 7/06; H01F 17/0013
See application file for complete search history.

(56) References Cited

U.S. PATENT DOCUMENTS 6,486,853 B2 * 11/2002 Yoshinomoto ......... H01Q 1/243
343/700 MS
8,072,387 B2 * 12/2011 Kimura ................ H01Q 1/2208
343/788
(Continued)

FOREIGN PATENT DOCUMENTS

JP 2003-218626 A 7/2003
JP 2005-219379 A 8/2005
(Continued)

OTHER PUBLICATIONS

Official Communication issued in International Patent Application No. PCT/JP2014/052021, dated Apr. 8, 2014.

*Primary Examiner* — Jessica Han
*Assistant Examiner* — Amal Patel
(74) *Attorney, Agent, or Firm* — Keating & Bennett, LLP

(57) ABSTRACT

A coil device includes a multilayer base including resin sheets having a conductor pattern thereon and being stacked on top of one another such that the conductor patterns define a coil. A winding axis of the coil is parallel or substantially parallel to surfaces of the resin sheets, and the conductor patterns include first linear portions provided on a surface of a first resin sheet and second linear portions provided on a surface of a second resin sheet. Surfaces of at least one of the first linear portions and the second linear portions having small surface roughness are oriented toward the inner peripheral surface of the coil to prevent an increase in loss due to the use of adhesive and due to roughening a surface of a metal foil.

18 Claims, 12 Drawing Sheets

(51) Int. Cl.
*H01Q 1/22* (2006.01)
*H01F 17/00* (2006.01)
*H01Q 1/24* (2006.01)
*H01Q 1/38* (2006.01)
*H01Q 23/00* (2006.01)

(52) U.S. Cl.
CPC ............... *H01Q 1/38* (2013.01); *H01Q 7/06* (2013.01); *H01Q 23/00* (2013.01); *H01L 2224/16225* (2013.01); *H01L 2924/15311* (2013.01); *H01L 2924/19105* (2013.01)

(56) References Cited

U.S. PATENT DOCUMENTS

2008/0129629 A1    6/2008   Kimura et al.
2012/0305657 A1   12/2012   Kato et al.

FOREIGN PATENT DOCUMENTS

| JP | 2008-172444 A | 7/2008 |
| JP | 2008-259039 A | 10/2008 |
| JP | 2012-195423 A | 10/2012 |
| WO | 2009/142114 A1 | 11/2009 |

* cited by examiner

COMPARATIVE EXAMPLE

COIL DEVICE AND ANTENNA DEVICE

BACKGROUND OF THE INVENTION

1. Field of the Invention

The present invention relates to a coil device including a multilayer base includes a plurality of base material layers on which conductor patterns are located and which are stacked on top of one another, the conductor patterns defining a coil, and also relates to an antenna device that includes the coil device.

2. Description of the Related Art

As described in Japanese Unexamined Patent Application Publication No. 2008-259039, an antenna that includes an insulating base in which a coil electrode is formed has been proposed as a coil antenna that can be built into a cellular phone terminal or the like. In general, in a small-sized antenna, the volume of the antenna and the gain of the antenna are approximately proportional to each other. As described in Japanese Unexamined Patent Application Publication No. 2008-259039, in the antenna, which includes the insulating base in an outer peripheral portion of which the coil electrode is formed, the volume of the antenna is large despite the smallness of the base, and thus, good antenna characteristics can be obtained.

However, since the antenna is formed by using an individual base, the antenna is not suitable for being formed so as to be thin. In the case of mounting another chip component on the antenna, the chip component can only be surface-mounted on the base, and thus, a mounting region for the chip component is limited.

On the other hand, as described in Japanese Unexamined Patent Application Publication No. 2003-218626, a method of forming an antenna coil in a substrate by using a method of manufacturing a multilayer wiring board has been proposed. In such a structure, the degree of freedom regarding the shape of an antenna circuit apparatus is large, a reduction in the thickness of the antenna circuit apparatus can be easily achieved, and a chip component can be easily incorporated into the antenna circuit apparatus.

The multilayer wiring board is formed of a plurality of resin sheets in which conductor patterns are formed and which are stacked on top of one another, and in a method of forming the conductor patterns by patterning metal foils, adhesive layers are usually interposed between the resin sheets and the metal foils when the metal foils are attached to the resin sheets. However, in general, adhesive has a large material loss (dielectric loss), and even in the case where a resin sheet that is made of, for example, a liquid crystal polymer that has a small material loss is used, a reduction in the loss cannot be achieved due to the influence of an adhesive layer. In other words, there has been a problem in that an advantage of the use of a liquid crystal polymer, which has a small material loss, cannot be obtained.

On the other hand, Japanese Unexamined Patent Application Publication No. 2005-219379 describes a composite material for use in a substrate for which an adhesive strength is obtained by roughening a joint surface of a metal foil that is to be joined to an insulating base in such a manner as to exert an anchor effect with respect to projections and depressions of the rough surface. However, in the case where a resin sheet to which a metal foil, which has a rough surface, has been attached is used, and where a coil is formed by patterning the metal foil, a high-frequency signal is influenced by the rough surface. In other words, the loss of the coil is increased, and the Q value of the coil is decreased. For example, in the case where an antenna coil is formed, a problem such as a reduction in a communication range occurs.

SUMMARY OF THE INVENTION

Accordingly, preferred embodiments of the present invention provide a coil device and an antenna device, in which a problem of an increase in loss as a result of using adhesive and a problem of an increase in loss as a result of roughening a surface of a metal foil are solved.

A coil device according to a preferred embodiment of the present invention includes a multilayer base including a plurality of resin sheets, some of which include a conductor pattern and which are stacked on top of one another, and a plurality of conductor patterns defining a coil. The coil has a winding axis that is parallel or substantially parallel to surfaces of the resin sheets. The conductor patterns include a plurality of first linear portions that are provided on the surface of a first resin sheet of the plurality of resin sheets, a plurality of second linear portions that are provided on the surface of a second resin sheet of the plurality of resin sheets, and interlayer connection conductors that electrically connect the first linear portions and the second linear portions to one another between the resin sheets. First surfaces of the first linear portions have smaller surface roughnesses than second surfaces of the first linear portions. Third surfaces of the second linear portions have smaller surface roughnesses than fourth surfaces of the second linear portions, and the first surfaces of the first linear portions or the third surfaces of the second linear portions are oriented toward an inner peripheral surface of the coil.

It is preferable that a mount electrode is provided on the surface of one of the plurality of resin sheets that defines as a mounting surface of the multilayer base. It is preferable that the first linear portions be positioned farther from the mounting surface of the multilayer base than the second linear portions, and that the first surfaces of the first linear portions be oriented toward the inner peripheral surface of the coil.

It is preferable that the first surfaces of the first linear portions are oriented toward the inner peripheral surface of the coil, and that the third surfaces of the second linear portions are oriented toward the inner peripheral surface of the coil.

The coil device preferably further includes a feeding circuit and the coil defines an antenna coil.

A chip component is preferably mounted on a surface of one of the plurality of resin sheets that is on an opposite side to the surface that defines the mounting surface of the multilayer base.

An antenna device according to another preferred embodiment of the present invention includes the coil device according to one of the preferred embodiments of the present invention described above and a booster antenna that is configured to be magnetic field coupled with the coil that is included in the coil device.

According to various preferred embodiments of the present invention, a low-loss coil device in which a problem of an increase in loss as a result of using adhesive and a problem of an increase in loss as a result of roughening a surface of a metal foil are avoided even though the coil device is formed of a plurality of resin sheets on which conductor patterns are provided and which are stacked on top of one another, and an antenna device are obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
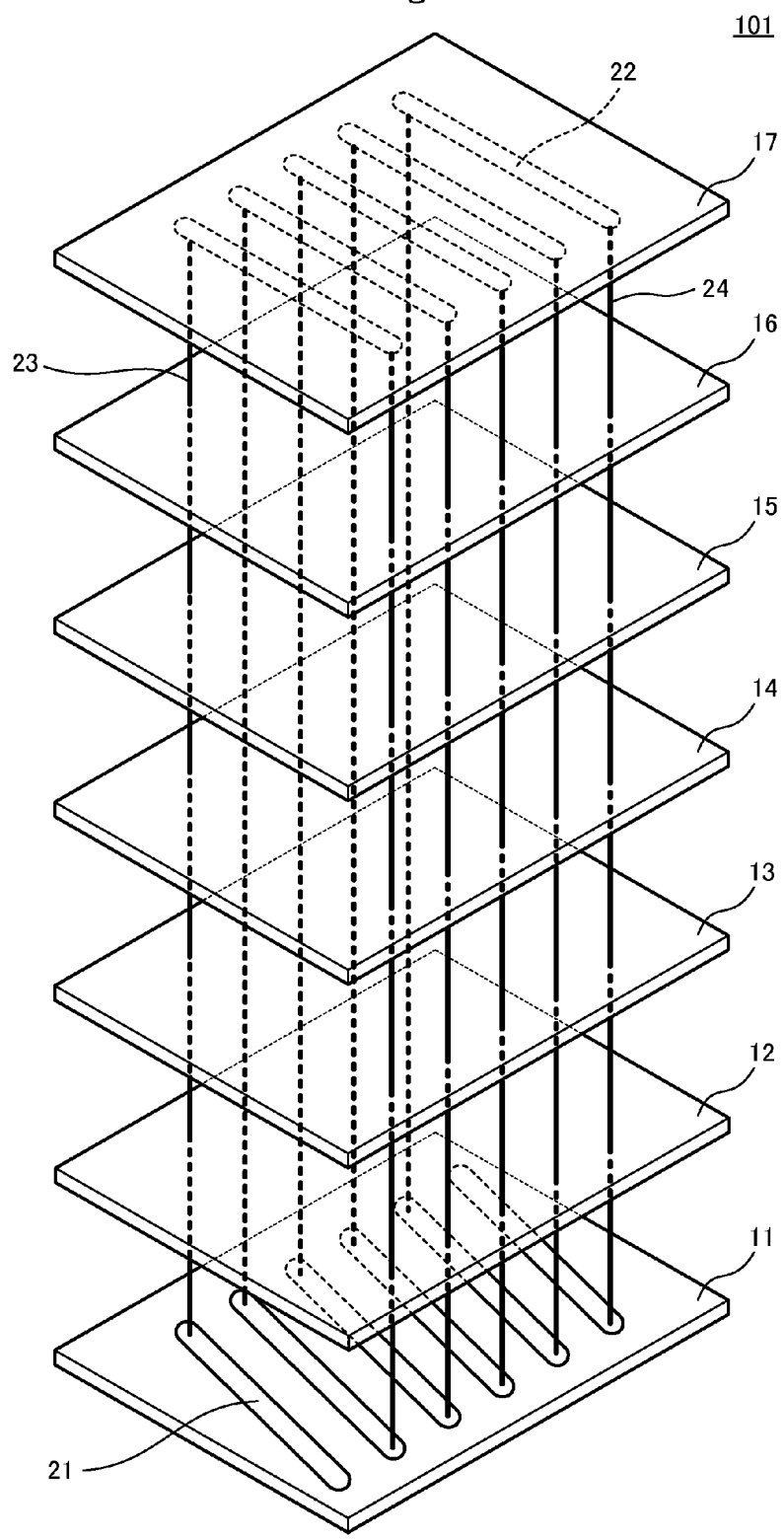
FIG. 1 is an exploded perspective view of a coil device 101 according to a first preferred embodiment of the present invention.
Figure 2:
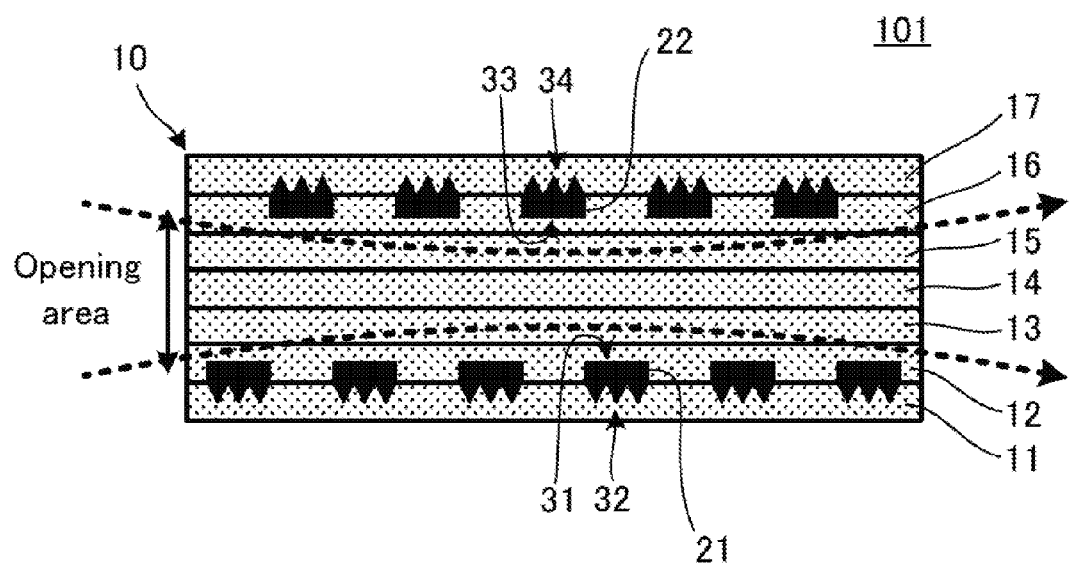
FIG. 2 is a sectional view of a principal portion of the coil device 101.

FIG. 1 is an exploded perspective view of a coil device 101 according to a first preferred embodiment of the present invention, and FIG. 2 is a sectional view of a principal portion of the coil device 101.

The coil device 101 includes a resin multilayer substrate 10 that includes a plurality of resin sheets 11 to 17, which are stacked on top of one another, and a coil conductor that is provided in the resin multilayer substrate 10. A plurality of first linear portions 21 of the coil conductor are provided on the upper surface of the resin sheet 11. A plurality of second linear portions 22 of the coil conductor are provided on the lower surface of the resin sheet 17. A plurality of via conductors (interlayer connection conductors) 23 and 24 of the coil conductor are provided in the resin sheets 12 to 16. The via conductors 23 connect first ends of the plurality of first linear portions 21 and respective first ends of the plurality of second linear portions 22. Similarly, the via conductors 24 connect second ends of the plurality of first linear portions 21 and respective second ends of the plurality of second linear portions 22. The linear portions 21 and 22 and the via conductors 23 and 24 define the horizontal helical coil conductor that is configured to preferably correspond to a shape of a flat square or substantially square cylinder.

Each of the linear portions 21 and 22 are configured by attaching a metal foil such as a copper foil to a resin sheet made of a liquid crystal polymer or the like and patterning the metal foil. Surfaces 32 and 34 of the metal foil that is attached to the resin sheet are roughened, and the metal foil is attached to the resin sheet without adhesive. Therefore, as illustrated in FIG. 2, the first linear portions 21 and the second linear portions 22 are arranged such that surfaces 31 and 33 of the first linear portions 21 and the second linear portions 22 each of which has a small surface roughness are oriented toward the inner peripheral surface of the coil (the winding range of the coil).

Figure 10:
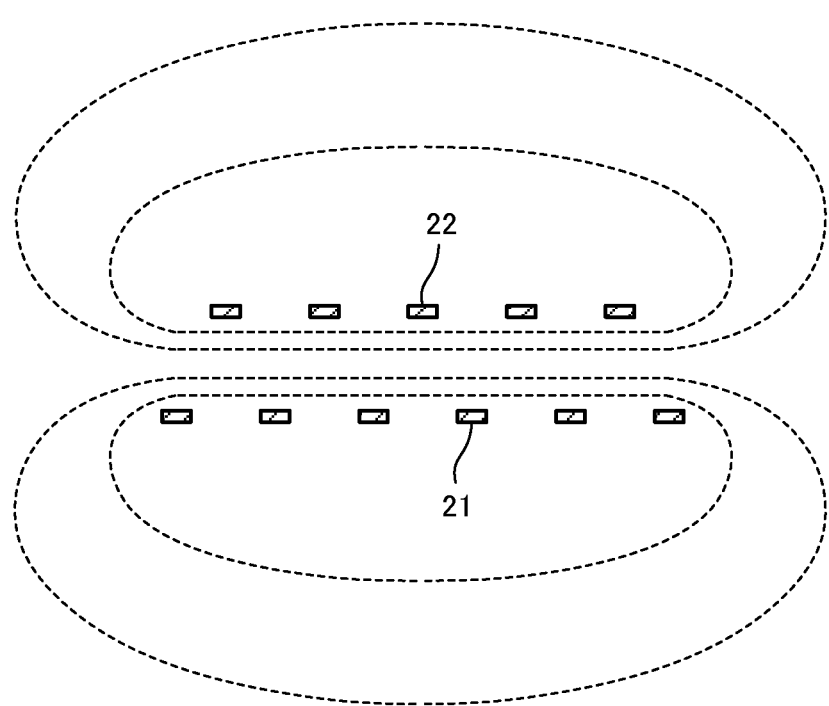
FIG. 10 is a diagram (sectional view) illustrating a coil conductor and the intensity of a magnetic field that is generated by the coil conductor.

FIG. 10 is a diagram (sectional view) illustrating a coil conductor and the intensity of a magnetic field that is generated by the coil conductor. The linear portions 21 and 22 are portions of the coil conductor. The dashed lines represent lines of magnetic force generated by the coil conductor, and the intensity distribution of the magnetic field is indicated by the density of the lines of magnetic force.

The magnetic field has a higher intensity in an area inside the coil than in an area outside the coil. Thus, a portion of each of the linear portions 21 and 22 on the side of the inner surface of the coil has a higher current density than that of a portion of each of the linear portions 21 and 22 on the side of the outer surface of the coil.

Figure 11:
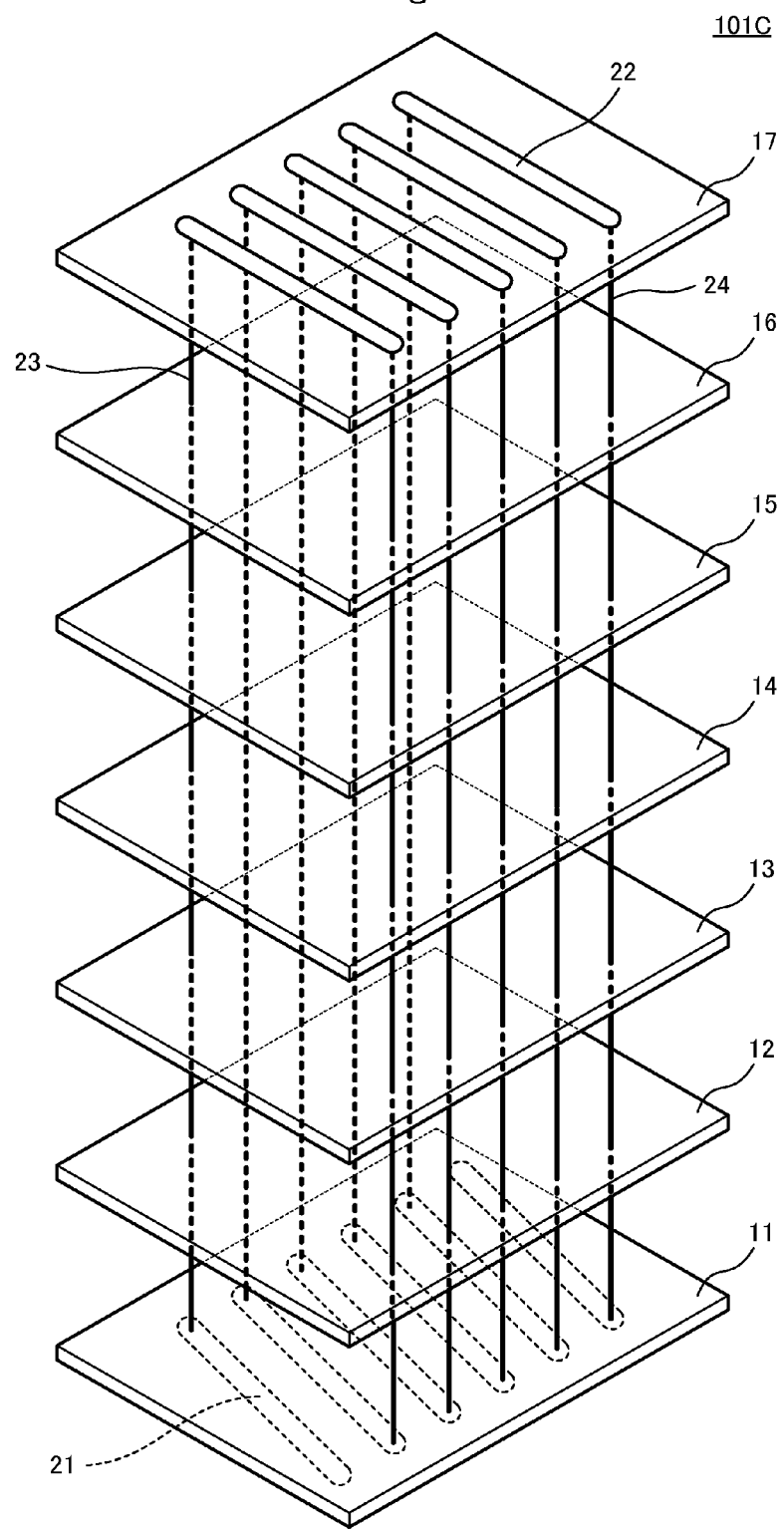
FIG. 11 is an exploded perspective view of a coil device 101C that is a comparative example of the present invention.
Figure 12:
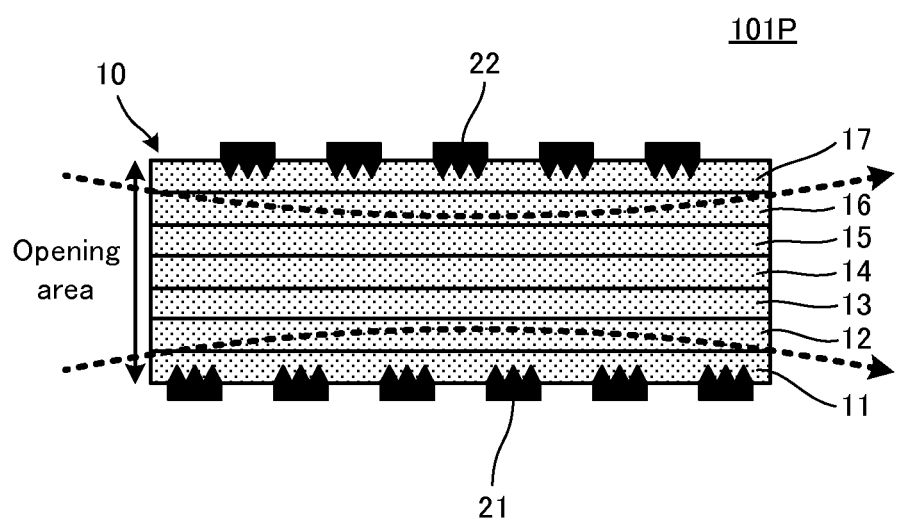
FIG. 12 is a sectional view of the coil device 101C, which is the comparative example.

FIG. 11 is an exploded perspective view of a coil device 101C that is a comparative example, and FIG. 12 is a sectional view of the coil device 101C. In the coil device 101C, which is a comparative example, the positions (surfaces) at which the first linear portions 21 and the second linear portions 22 are provided are different from those in the coil device 101 of the first preferred embodiment, which is illustrated in FIG. 1 and FIG. 2. In the coil device 101C, which is a comparative example, the first linear portions 21 are provided on the lower surface of the resin sheet 11, and the second linear portions 22 are provided on the upper surface of the resin sheet 17.

Although the number of layers of the resin sheets is the same in the coil devices 101 and 101C, as is apparent by comparing FIG. 2 and FIG. 12, the coil device 101C, which is the comparative example, has an opening area larger than that of the coil device 101 of the first preferred embodiment. Thus, a relatively large coil is provided in a limited space. However, the linear portions 21 and 22 are arranged such that the surfaces of the linear portions 21 and 22, which have been roughened, are oriented toward the inner peripheral surface of the coil. In other words, the current density of each of the surfaces, which have been roughened, is high. This results in a large loss. On the other hand, in the coil device 101 of the first preferred embodiment, a low-loss coil device is obtained.

Second Preferred Embodiment

Figure 3:
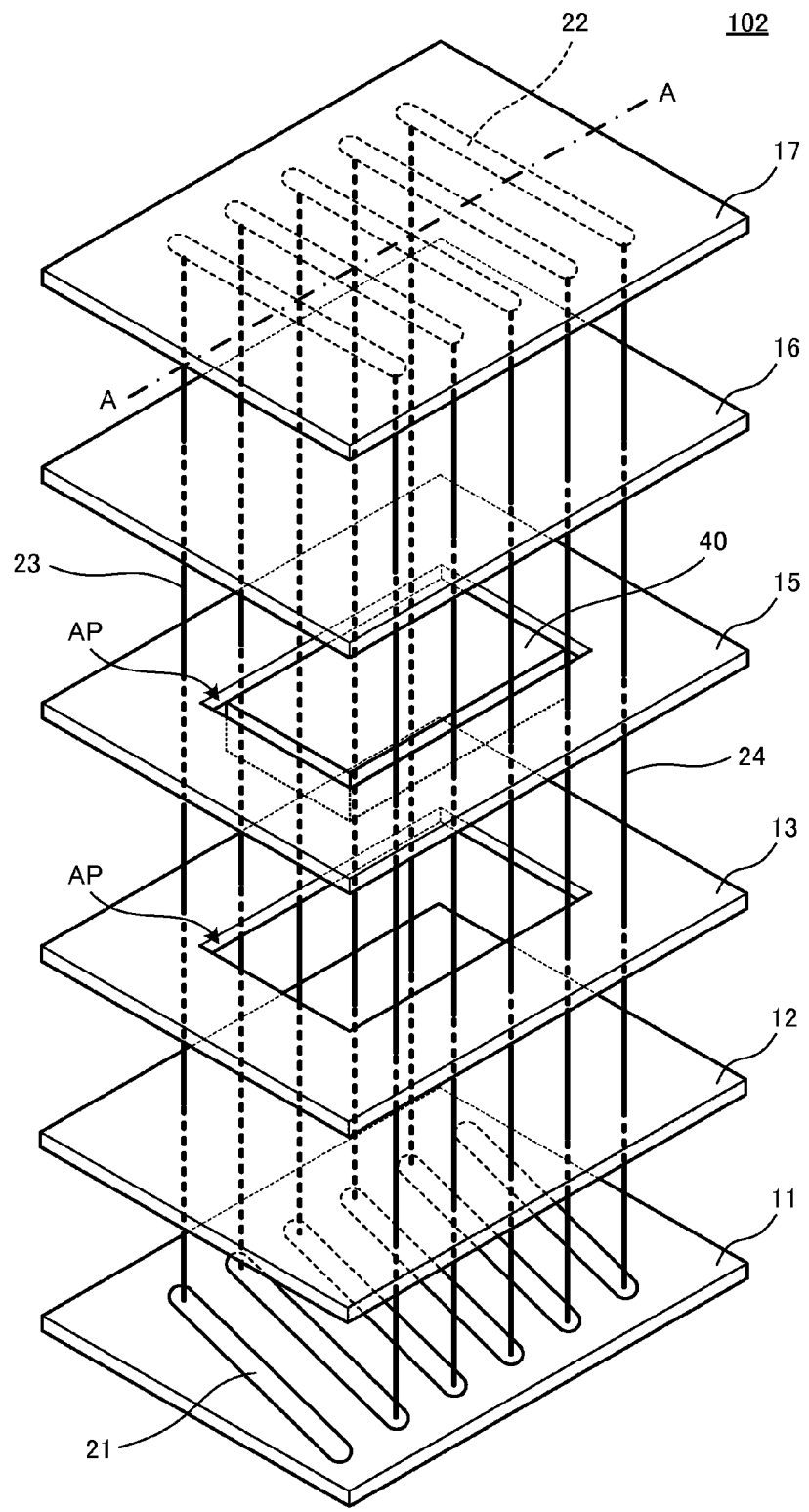
FIG. 3 is an exploded perspective view of a coil device 102 according to a second preferred embodiment of the present invention.
Figure 4:
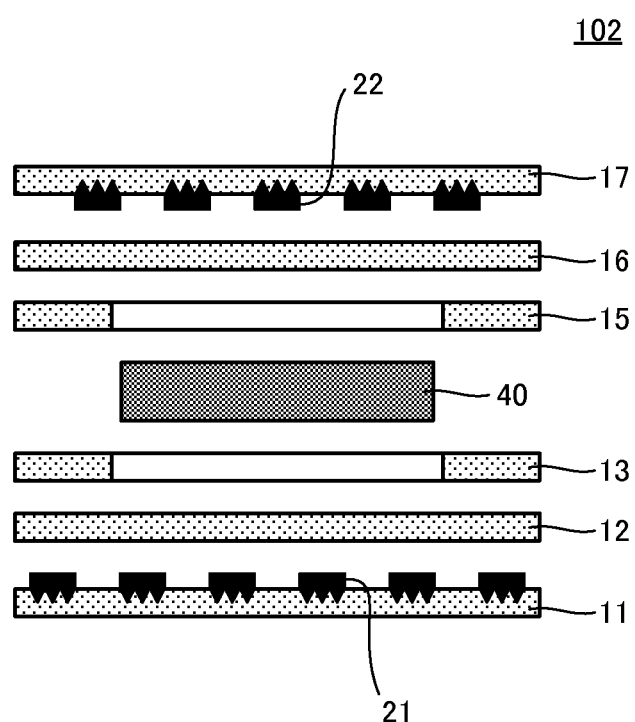
FIG. 4 is a sectional view of the coil device 102 taken along line A-A of FIG. 3.

FIG. 3 is an exploded perspective view of a coil device 102 according to a second preferred embodiment of the present invention, and FIG. 4 is a sectional view of the coil device 102 taken along line A-A of FIG. 3.

The coil device 102 includes a resin multilayer substrate that includes a plurality of resin sheets 11 to 13 and 15 to 17, which are stacked on top of one another, and a coil conductor that is provided in the resin multilayer substrate. A plurality of first linear portions 21 of the coil conductor are provided on the upper surface of the resin sheet 11. A plurality of second linear portions 22 of the coil conductor are provided on the lower surface of the resin sheet 17.

Openings AP are provided in center portions of the resin sheets 13 and 15. A cavity is defined by these openings AP, and a magnetic core 40 is embedded in the cavity.

A plurality of via conductors (interlayer connection conductors) 23 and 24 of the coil conductor are provided in the resin sheets 12, 13, 15, and 16. These via conductors 23 connect first ends of the plurality of first linear portions 21 and respective first ends of the plurality of second linear portions 22. Similarly, the via conductors 24 connect second ends of the plurality of first linear portions 21 and respective second ends of the plurality of second linear portions 22. The linear portions 21 and 22 and the via conductors 23 and 24 define the horizontal helical coil conductor that preferably corresponds to the shape of a flat square or substantially square cylinder.

As described above, the coil device 102 includes a magnetic-core coil that includes the above-described coil conductor and the magnetic core 40. This coil device is preferably used as, for example, a coil antenna.

Third Preferred Embodiment

Figure 5:
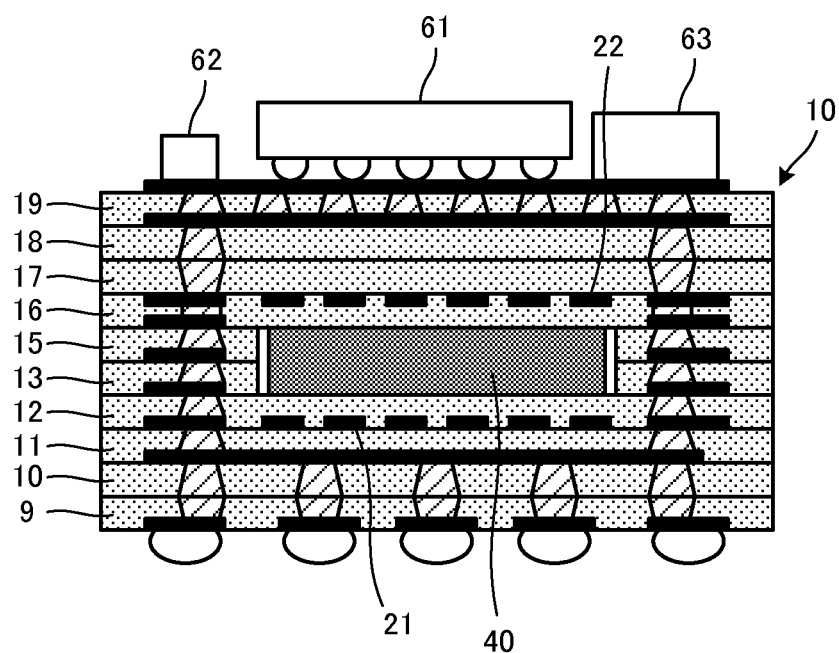
FIG. 5 is a sectional view of an antenna-integrated type RF module according to a third preferred embodiment of the present invention.

FIG. 5 is a sectional view of an antenna-integrated type RF module according to a third preferred embodiment of the present invention. The antenna-integrated type RF module 201 includes a resin multilayer substrate 10 that includes a plurality of resin sheets 9 to 13 and 15 to 19, which are stacked on top of one another, and a coil conductor that is provided in the resin multilayer substrate 10. A plurality of first linear portions 21 of the coil conductor are provided on the upper surface of the resin sheet 11. A plurality of second linear portions 22 of the coil conductor are provided on the lower surface of the resin sheet 17.

Openings are provided in center portions of the resin sheets 13 and 15. A cavity is defined by these openings, and a magnetic core 40 is embedded in the cavity.

A plurality of via conductors (interlayer connection conductors) of the coil conductor are provided in the resin sheets 12, 13, 15, and 16, and these via conductors and the linear portions 21 and 22 define the horizontal helical coil conductor that preferably corresponds the shape of a flat square or substantially square cylinder.

In addition, a wiring line and a circuit that are defined by other via conductors and electrodes are provided in the resin multilayer substrate 10. Mount components 61, 62, and 63 are mounted on the upper surface of the resin multilayer substrate 10. Terminal electrodes are provided on the lower surface (mounting surface) of the resin multilayer substrate 10.

Each of the mount components 61, 62, and 63 is an RFIC, a chip capacitor, a chip inductor, or the like. A circuit that includes these components defines a feeding circuit for the coil. The antenna-integrated type RF module 201 is used as, for example, a near field communication module such as an NFC module. A wireless communication device that has a near field communication function is provided by mounting the antenna-integrated type RF module 201 on a mounting substrate, the antenna-integrated type RF module 201 to be built into the mounting substrate.

Fourth Preferred Embodiment

Figure 6:
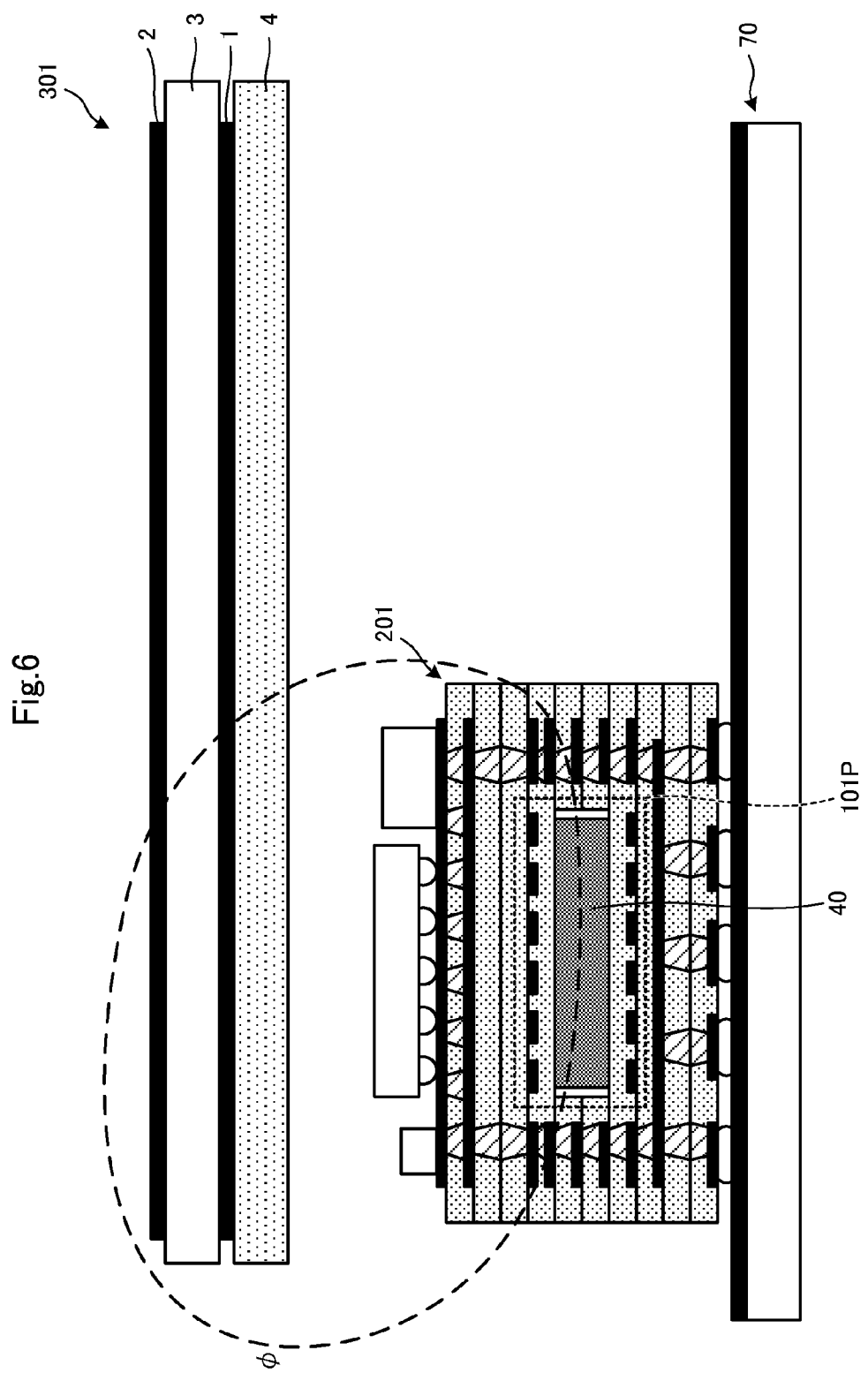
FIG. 6 is a sectional view of a principal portion of an antenna device according to a fourth preferred embodiment of the present invention.

FIG. 6 is a sectional view of a principal portion of an antenna device according to a fourth preferred embodiment of the present invention. However, in this example, the antenna device is not a simple antenna device but an antenna device that is provided together with an antenna-integrated type RF module 201 (i.e., an antenna device that includes an RF module). The antenna device includes the antenna-integrated type RF module 201 that is mounted on a mounting substrate 70 and a booster coil 301. The configuration of the antenna-integrated type RF module 201 is the same as that described in the third preferred embodiment. However, in the present preferred embodiment, an antenna portion 101P in the antenna-integrated type RF module 201 is used as a feeding coil that is used to supply RF signal to the booster coil 301.

Figure 7:
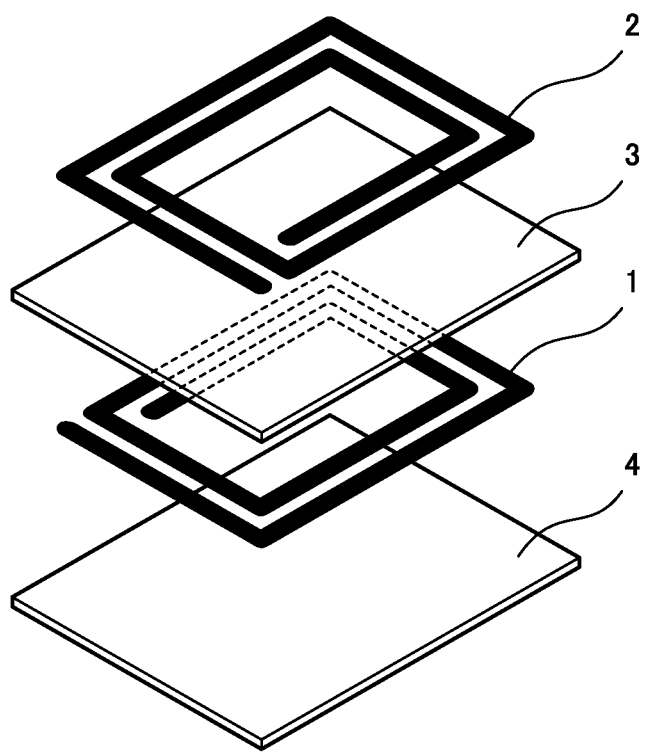
FIG. 7 is an exploded perspective view of a booster coil 301.

FIG. 7 is an exploded perspective view of the booster coil 301. The booster coil 301 includes an insulating base member 3, a first coil 1 that is provided on a first surface of the insulating base member 3, a second coil 2 that is provided on a second surface of the insulating base member 3, and a magnetic sheet 4. The first coil 1 and the second coil 2 are conductors each of which is patterned in a square or substantially square spiral shape and are patterned and configured to be capacitively coupled with each other in a state where a current flows through the first coil 1 and the second coil 2 in the same direction when viewed in plan. The two coil conductors are patterned and configured such that, when viewed in plan from the same direction, when a current flows through one of the coil conductors clockwise, the current also flows through the other one of the coil conductors clockwise.

As illustrated in FIG. 6 with a magnetic flux $\phi$, the antenna portion 101P of the RF module 201 and the booster coil 301 are configured to be magnetic field coupled with each other. The magnetic sheet 4 is thin to such an extent as to not interfere with the magnetic field coupling between the antenna portion 101P of the RF module 201 and the booster coil 301. In addition, the magnetic sheet 4 blocks a magnetic field that is generated by the booster coil 301 and significantly reduces or prevents generation of an eddy current in a ground conductor that is provided on the mounting substrate 70. Note that the magnetic sheet 4 need not be provided.

Although the antenna device that is provided together with the antenna-integrated type RF module 201 (i.e., the antenna device that includes the RF module) has been described in the present preferred embodiment, the antenna device may have a configuration in which an RF module is not included. For example, the antenna device may be a combination of the coil device 101 or 102 and the booster coil 301.

Figure 8:
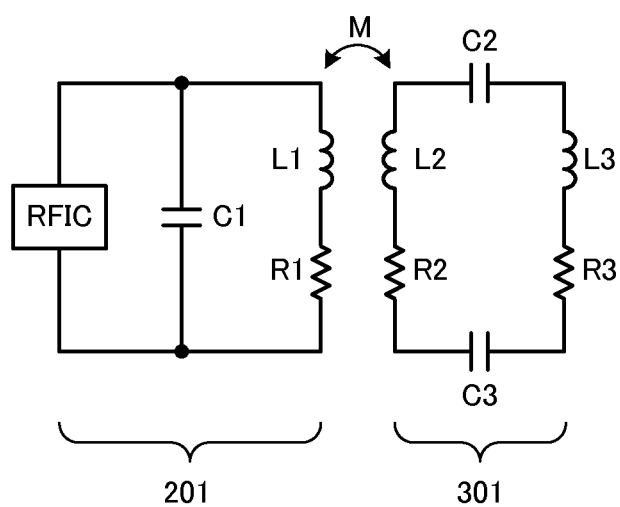
FIG. 8 is an equivalent circuit diagram of the antenna device illustrated in FIG. 6.

FIG. 8 is an equivalent circuit diagram of the antenna device illustrated in FIG. 6. The antenna-integrated type RF module 201 includes an inductance component L1 that is defined by a coil conductor of the antenna portion 101P and the magnetic core 40, a resistance component R1 of the antenna portion 101P, a capacitor C1, an RFIC, and the like. The capacitor C1 is a capacitance that is used to adjust the resonant frequency of the antenna portion (a feeding coil) 101P. The booster coil 301 includes inductance components L2 and L3 of the first coil 1 and the second coil 2, a capacitance components C2 and C3 that are generated between the first coil 1 and the second coil 2, resistance components R2 and R3 of the first coil 1 and the second coil 2, and the like.

As described above, the antenna portion 101P, which is provided in the resin multilayer substrate 10, may be used as a feeding coil, and the booster coil 301, which is a different member from the resin multilayer substrate 10, may be used as a booster antenna. As a result, the longest communication range is significantly extended.

Figure 9:
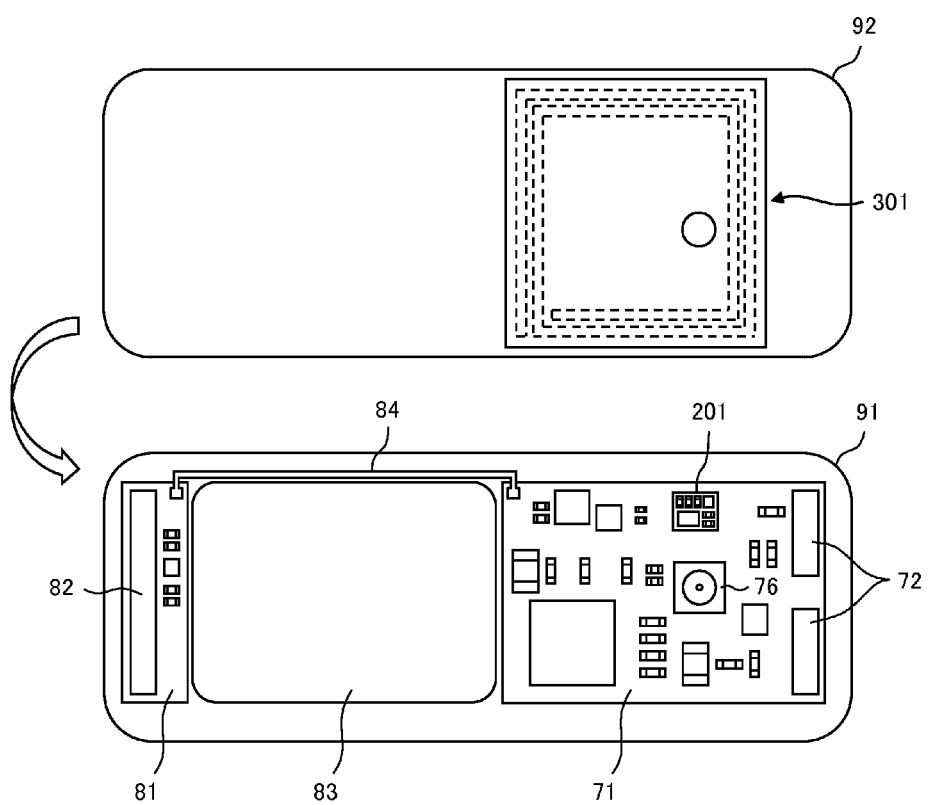
FIG. 9 is a diagram illustrating the structure inside a housing of a wireless communication device 401 that includes the antenna device, which is illustrated in FIG. 6, and is a plan view in a state where the interior of the casing is exposed by isolating a lower housing 91 and an upper housing 92 from each other.

FIG. 9 is a diagram illustrating the structure inside a housing of a wireless communication device 401 that includes the antenna device, which is illustrated in FIG. 6, and is a plan view in a state where the interior of the casing is exposed by isolating a lower housing 91 and an upper housing 92 from each other. The wireless communication device 401 includes the antenna-integrated type RF module 201 and the booster coil 301, which are illustrated in FIG. 6.

Printed wiring boards 71 and 81, a battery pack 83, and the like are accommodated in the lower housing 91. The antenna-integrated type RF module 201 is mounted on the printed wiring board 71. A UHF antenna 72, a camera module 76, and the like are also mounted on the printed wiring board 71. A UHF antenna 82 and the like are mounted on the printed wiring board 81. The printed wiring board 71 and the printed wiring board 81 are connected via a coaxial cable 84.

The booster coil 301 is provided on the inner surface of the upper housing 92. The booster coil 301 is configured to be magnetic field coupled with the antenna portion (feeding coil) of the antenna-integrated type RF module 201.

Note that although the case where the first linear portions 21 and the second linear portions 22 preferably are arranged such that the surfaces of both the first linear portions 21 and the second linear portions 22, each of which has a small surface roughness, are oriented toward the inner peripheral surface of the coil has been described in the first preferred embodiment and the second preferred embodiment, the loss reduction effect may be obtained even in the case where the first linear portions 21 or the second linear portions 22 are arranged in such a manner that the surfaces of the first linear portions 21 or the second linear portions 22, each of which has a small surface roughness, are oriented toward the inner peripheral surface of the coil.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil device comprising:
a multilayer base including a plurality of resin sheets which are stacked on top of one another and some of which include a conductor pattern such that a plurality of conductor patterns define a coil; wherein
a winding axis of the coil is parallel or substantially parallel to surfaces of the resin sheets;
the conductor patterns include a plurality of first linear portions on a surface of a first resin sheet of the plurality of resin sheets, a plurality of second linear portions on a surface of a second resin sheet of the plurality of resin sheets, and interlayer connection conductors configured to electrically connect the first linear portions and the second linear portions to one another between the resin sheets;
first surfaces of the first linear portions have smaller surface roughnesses than second surfaces of the first linear portions;
third surfaces of the second linear portions have smaller surface roughnesses than fourth surfaces of the second linear portions;
the first surfaces of the first linear portions or the third surfaces of the second linear portions are oriented toward an inner peripheral surface of the coil;
the second surfaces of the first linear portions are oriented toward a direction opposite to a direction toward which the first surfaces of the first linear portions are oriented; and
the fourth surfaces of the second linear portions are oriented toward a direction opposite to a direction toward which the third surfaces of the second linear portions are oriented.

2. The coil device according to claim 1, wherein
a mount electrode is provided on a surface of one of the plurality of resin sheets that defines a mounting surface of the multilayer base;
the first linear portions are positioned farther from the mounting surface of the multilayer base than the second linear portions; and
the first surfaces of the first linear portions are oriented toward the inner peripheral surface of the coil.

3. The coil device according to claim 1, wherein
the first surfaces of the first linear portions are oriented toward the inner peripheral surface of the coil; and
the third surfaces of the second linear portions are oriented toward the inner peripheral surface of the coil.

4. The coil device according to claim 1, further comprising a feeding circuit, wherein the coil defines an antenna coil.

5. The coil device according to claim 1, wherein a chip component is mounted on a surface of one of the plurality of resin sheets that is on an opposite side to a surface that defines a mounting surface of the multilayer base.

6. The coil device according to claim 1, wherein the multilayer base includes the interlayer connection conductors configured to connect the conductor patterns to each other.

7. The coil device according to claim 1, wherein the coil has a shape of flat square or substantially square cylinder.

8. The coil device according to claim 1, wherein at least two of the resin sheets include openings provided therein.

9. The coil device according to claim 8, wherein the openings define a cavity and a magnetic core is located in the cavity.

10. An antenna device comprising:
the coil device according to claim 1; and
a booster antenna configured to be magnetic field coupled with the coil that is included in the coil device.

11. The antenna device according to claim 10, wherein the booster antenna includes an insulating base member, a first coil on a first surface of the insulating base member, a second coil on a second surface of the insulating base member, and a magnetic sheet.

12. The antenna device according to claim 11, wherein the first coil and the second coil are conductors each of which is patterned in a square or substantially square spiral shape and are patterned and configured to be capacitively coupled with each other in a state where a current flows through the first coil and the second coil in the same direction when viewed in plan.

13. An antenna-integrated module comprising the coil device according to claim 1.

14. The antenna-integrated module according to claim 13, further comprising a plurality of components comprising at least one of an RFIC, a chip capacitor and a chip inductor mounted on the multilayer base and configured to define a feeding circuit for the coil.

15. The antenna-integrated module according to claim 13, wherein the antenna-integrated module is a near field communication module.

16. An antenna-integrated module comprising the coil device according to claim 9.

17. The antenna-integrated module according to claim 16, further comprising a plurality of components comprising at least one of an RFIC, a chip capacitor and a chip inductor mounted on the multilayer base and configured to define a feeding circuit for the coil.

18. The antenna-integrated module according to claim 16, wherein the antenna-integrated module is a near field communication module.

\* \* \* \* \*